US009588148B2

(12) United States Patent
Cook et al.

(10) Patent No.: US 9,588,148 B2
(45) Date of Patent: Mar. 7, 2017

(54) INPUT CIRCUIT FOR CURRENT TRANSFORMER

(71) Applicant: Veris Industries, LLC, Tualatin, OR (US)

(72) Inventors: Martin Cook, Tigard, OR (US); David Pierson, Tigard, OR (US); Michael L. Johnson, Molalla, OR (US)

(73) Assignee: Veris Industries, LLC, Tualatin, OR (US)

( * ) Notice: Subject to any disclaimer, the term of this patent is extended or adjusted under 35 U.S.C. 154(b) by 77 days.

(21) Appl. No.: 14/602,986

(22) Filed: Jan. 22, 2015

(65) Prior Publication Data

US 2015/0219691 A1    Aug. 6, 2015

Related U.S. Application Data

(60) Provisional application No. 61/930,843, filed on Jan. 23, 2014.

(51) Int. Cl.
| | |
|---|---|
| *G01R 15/18* | (2006.01) |
| *H02M 1/00* | (2006.01) |
| *H02J 1/00* | (2006.01) |
| *G01R 1/00* | (2006.01) |

(52) U.S. Cl.
CPC .............. *G01R 15/183* (2013.01); *G01R 1/00* (2013.01); *H02J 1/00* (2013.01); *H02M 1/00* (2013.01)

(58) Field of Classification Search
CPC ... H02M 1/00; G01R 1/00; H02J 1/00; H01H 1/00; H01H 45/00; H01H 63/00
See application file for complete search history.

(56) References Cited

U.S. PATENT DOCUMENTS

| | | | |
|---|---|---|---|
| 1,100,171 | A | 6/1914 | Brown |
| 1,455,263 | A | 5/1923 | Oberfell |
| 1,569,723 | A | 1/1926 | Dickinson |
| 1,800,474 | A | 4/1931 | Scherer |
| 1,830,541 | A | 11/1931 | Harris |
| 1,871,710 | A | 8/1932 | Lenehan |
| 2,059,594 | A | 11/1936 | Massa, Jr. |
| 2,411,405 | A | 11/1946 | Yuhas |
| 2,412,782 | A | 12/1946 | Palmer |

(Continued)

*Primary Examiner* — Huy Q Phan
*Assistant Examiner* — Temilade Rhodes-Vivour
(74) *Attorney, Agent, or Firm* — Chernoff Vilhauer McClung & Stenzel, LLP (57) ABSTRACT

A transformer for monitoring current in a power cable is magnetically linked with the power cable connected to the electrical device, where the transformer produces a changing transformer signal in response to the presence of a changing current within the power cable. An input circuit located proximate to the transformer and having an output terminal and being electrically connected to the transformer so as to receive the changing transformer signal. The input circuit produces, in response to receiving the changing transformer signal, one of a first signal representative of the changing current, and a first circuit condition at the output terminal of the input circuit representative of the changing current in the power cable. The input circuit includes an impedance set having an effective impedance that comprises a plurality of elements, wherein at least one of the elements is not electrically connected to the remaining the plurality of elements.

8 Claims, 12 Drawing Sheets

(56) References Cited

U.S. PATENT DOCUMENTS

| | | | |
|---|---|---|---|
| 2,428,613 A | 10/1947 | Boyajian | |
| 2,428,784 A | 10/1947 | Cole | |
| 2,512,070 A | 6/1950 | Nelsen et al. | |
| 2,663,190 A | 12/1953 | Ilgenfritz | |
| 2,746,295 A | 5/1956 | Lubkin | |
| 2,802,182 A | 8/1957 | Godshalk et al. | |
| 2,852,739 A | 9/1958 | Hansen | |
| 2,943,488 A | 7/1960 | Strobel et al. | |
| 3,190,122 A | 6/1965 | Edwards | |
| 3,243,674 A | 3/1966 | Ebert | |
| 3,287,974 A | 11/1966 | Clemochowski | |
| 3,374,434 A | 3/1968 | Perry | |
| 3,493,760 A | 2/1970 | Hoadley | |
| 3,512,045 A | 5/1970 | Tipton et al. | |
| 3,584,294 A | 6/1971 | Siwko | |
| 3,593,078 A | 7/1971 | Domshy | |
| 3,696,288 A | 10/1972 | Carman | |
| 3,728,705 A | 4/1973 | Atkins | |
| 3,769,548 A | 10/1973 | Pardue | |
| 3,772,625 A | 11/1973 | Raupach | |
| 3,861,411 A | 1/1975 | Mitchell et al. | |
| 3,955,701 A | 5/1976 | Fisch | |
| 3,976,924 A | 8/1976 | Vanjani | |
| 4,001,647 A | 1/1977 | Klein et al. | |
| 4,001,758 A | 1/1977 | Esper et al. | |
| 4,007,401 A | 2/1977 | Kimmel et al. | |
| 4,030,058 A | 6/1977 | Riffe et al. | |
| 4,048,605 A | 9/1977 | McCollum | |
| 4,058,768 A | 11/1977 | Milkovic | |
| 4,096,436 A | 6/1978 | Cook et al. | |
| 4,107,519 A | 8/1978 | Bicek | |
| D249,883 S | 10/1978 | Collins | |
| 4,124,030 A | 11/1978 | Roberts | |
| 4,151,578 A | 4/1979 | Bell | |
| 4,158,217 A | 6/1979 | Bell | |
| 4,158,810 A | 6/1979 | Leskovar | |
| 4,177,496 A | 12/1979 | Bell et al. | |
| 4,198,595 A | 4/1980 | Milkovic | |
| 4,207,604 A | 6/1980 | Bell | |
| 4,215,278 A | 7/1980 | Barbier et al. | |
| 4,227,419 A | 10/1980 | Park | |
| 4,241,237 A | 12/1980 | Paraskevakos et al. | |
| 4,249,264 A | 2/1981 | Crochet et al. | |
| 4,250,449 A | 2/1981 | Shum | |
| 4,253,336 A | 3/1981 | Pietzuch | |
| 4,258,348 A | 3/1981 | Belfer et al. | |
| 4,297,741 A | 10/1981 | Howell | |
| 4,328,903 A | 5/1982 | Baars | |
| 4,354,155 A | 10/1982 | Speidel et al. | |
| 4,359,672 A | 11/1982 | Hart | |
| 4,362,580 A | 12/1982 | Kane et al. | |
| 4,363,061 A | 12/1982 | Vaerewyck et al. | |
| 4,371,814 A | 2/1983 | Hannas | |
| 4,373,392 A | 2/1983 | Nagamoto | |
| 4,384,289 A | 5/1983 | Stillwell et al. | |
| 4,386,280 A | 5/1983 | Ricaud et al. | |
| 4,388,668 A | 6/1983 | Bell et al. | |
| 4,393,714 A | 7/1983 | Schmidt | |
| 4,398,426 A | 8/1983 | Park et al. | |
| 4,408,175 A | 10/1983 | Nelson et al. | |
| 4,413,193 A | 11/1983 | Crockett | |
| 4,413,230 A | 11/1983 | Miller | |
| 4,426,673 A | 1/1984 | Bell et al. | |
| 4,432,238 A | 2/1984 | Tward | |
| 4,475,081 A | 10/1984 | Kobayashi | |
| 4,491,790 A | 1/1985 | Miller | |
| 4,495,463 A | 1/1985 | Milkovic | |
| 4,506,199 A | 3/1985 | Asche | |
| 4,558,310 A | 12/1985 | Mcallise | |
| 4,558,595 A | 12/1985 | Kompelien | |
| 4,574,266 A | 3/1986 | Valentine | |
| 4,605,883 A | 8/1986 | Cockroft | |
| 4,621,532 A | 11/1986 | Takagi et al. | |
| 4,660,407 A | 4/1987 | Takami et al. | |
| 4,709,339 A | 11/1987 | Fernandes | |
| 4,739,229 A | 4/1988 | Heiler, Jr. | |
| 4,746,809 A | 5/1988 | Coleman et al. | |
| 4,754,365 A | 6/1988 | Kazahaya | |
| 4,757,416 A | 7/1988 | Wilkerson | |
| 4,758,962 A | 7/1988 | Fernandes | |
| 4,783,748 A | 11/1988 | Swarztrauber et al. | |
| 4,788,620 A * | 11/1988 | Scott | H02H 3/006 324/130 |
| 4,794,327 A | 12/1988 | Fernandes | |
| 4,808,910 A | 2/1989 | Kessi | |
| D301,331 S | 5/1989 | Rhodin | |
| 4,851,803 A | 7/1989 | Hahn | |
| 4,855,671 A | 8/1989 | Fernandes | |
| 4,874,904 A | 10/1989 | DeSanti | |
| 4,885,655 A | 12/1989 | Springer et al. | |
| 4,887,018 A | 12/1989 | Libert | |
| 4,890,318 A | 12/1989 | Crane et al. | |
| 4,926,105 A | 5/1990 | Mischenko et al. | |
| 4,939,451 A | 7/1990 | Baran et al. | |
| 4,944,187 A | 7/1990 | Frick et al. | |
| 4,956,588 A | 9/1990 | Ming | |
| 5,138,235 A * | 8/1992 | Sun | H05B 41/2985 315/209 R |
| 5,449,991 A | 9/1995 | Owen | |
| 6,018,239 A | 1/2000 | Berkcan et al. | |
| 6,118,077 A | 9/2000 | Takeuchi | |
| 6,507,261 B1 | 1/2003 | Haga et al. | |
| 6,950,292 B2 | 9/2005 | Holce et al. | |
| 7,239,491 B1 * | 7/2007 | Morgan | H02H 3/338 361/42 |
| 7,359,809 B2 | 4/2008 | Bruno | |
| 7,447,603 B2 | 11/2008 | Bruno | |
| 7,969,271 B2 | 6/2011 | Lai et al. | |
| 8,421,443 B2 | 4/2013 | Bitsch | |
| 8,860,242 B1 * | 10/2014 | Pruett | H02J 4/00 307/5 |
| 2005/0127895 A1 | 6/2005 | Rittmann | |
| 2006/0129339 A1 | 6/2006 | Bruno | |
| 2007/0024216 A1 * | 2/2007 | Jo | G09G 1/04 315/364 |
| 2007/0205750 A1 | 9/2007 | Yakymyshyn et al. | |
| 2010/0207604 A1 | 8/2010 | Bitsch | |
| 2011/0012661 A1 * | 1/2011 | Binder | A63F 9/24 327/276 |
| 2011/0068626 A1 * | 3/2011 | Terlizzi | H02J 1/08 307/32 |
| 2011/0260535 A1 * | 10/2011 | Wanner | H02M 3/1588 307/41 |
| 2013/0229171 A1 * | 9/2013 | Gunn | G01R 15/183 324/127 |
| 2013/0271895 A1 | 10/2013 | Kuhns | |
| 2014/0184198 A1 * | 7/2014 | Cook | G01R 21/133 324/107 |

* cited by examiner

INPUT CIRCUIT FOR CURRENT TRANSFORMER

CROSS-REFERENCE TO RELATED APPLICATIONS

This application claims the benefit of U.S. Provisional App. No. 61/930,843, filed Jan. 23, 2014.

BACKGROUND OF THE INVENTION

The present invention relates to a current transformer.

Currents in each of the branch circuits in a facility are typically measured by connecting a current sensor to sense the current flowing in each of the branch power cables exiting the facility's power distribution panel. Generally, a current sensor comprises a sensing transformer installed on an electrical conductor of interest and an electronic circuit that produces an output representative of the electrical current carried by the conductor. The current sensor may be an individual meter for a single circuit or a networked meter that can be temporarily connected, respectively, to each of a plurality of circuits to periodically and momentarily monitor the current in each circuit.

The typical sensing transformer used to sense the electrical current flowing in a power cable comprises a coil of wire wrapped around the cross-section of a magnetically permeable core that encircles the power cable. A sensing transformer with a hinged, split toroidal core is often used because the transformer can be easily affixed to an installed power cable without disconnecting the power cable from a connected device, such as, a circuit breaker in a distribution panel. Cota, U.S. Pat. No. 5,502,374 discloses a split core sensing transformer comprising a toroidal housing divided into a pair of housing halves. Each half of the housing retains a half of the toroidal core of the transformer. The housing halves are interconnected by a hinge located near one end of each half of the housing. The hinge permits pivoting of the housing halves to separate the ends of the housing halves opposite the hinge. The power conductor is passed between the separated ends of the housing halves and the housing halves are then pivoted together encircling the centrally positioned power conductor with the two halves of the toroidal core. On the ends of the housing halves opposite the hinge, a ridge on one housing half and a matching recess on the other half of the housing form a latch to hold the hinged housing halves closed around the power conductor.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Referring in detail to FIGS. 1-7 where similar parts of the invention are identified by like reference numerals, a sensing transformer 20 comprises a magnetically permeable toroidal core 22 that substantially encircles a power conductor 26 (or more than one power conductor) that is connected to conduct an electrical current to be measured. The core 22 is a ferrous torus typically having a rectangular or circular cross-section. One or more turns of wire 28 (or more than one wire) are wrapped around the cross-section of a sector 24 (indicated by a bracket) of the toroidal core 22.

A changing current (i.e. alternating current) in a power conductor produces a changing magnetic field around the conductor which, in turn, induces a magnetic flux in the magnetically permeable core of a sensing transformer encircling the power conductor. The magnetic flux in the toroidal core induces a current in the wire windings that is representative of the current flowing in the power conductor. Thus, the power conductor is the primary winding and the wire winding is the secondary winding of the sensing transformer. The ends of the wire winding are electrically connected to a burden resistor that converts the current signal received from the secondary winding of the sensing transformer to a voltage signal representing the current flowing in the conductor.

Figure 1:
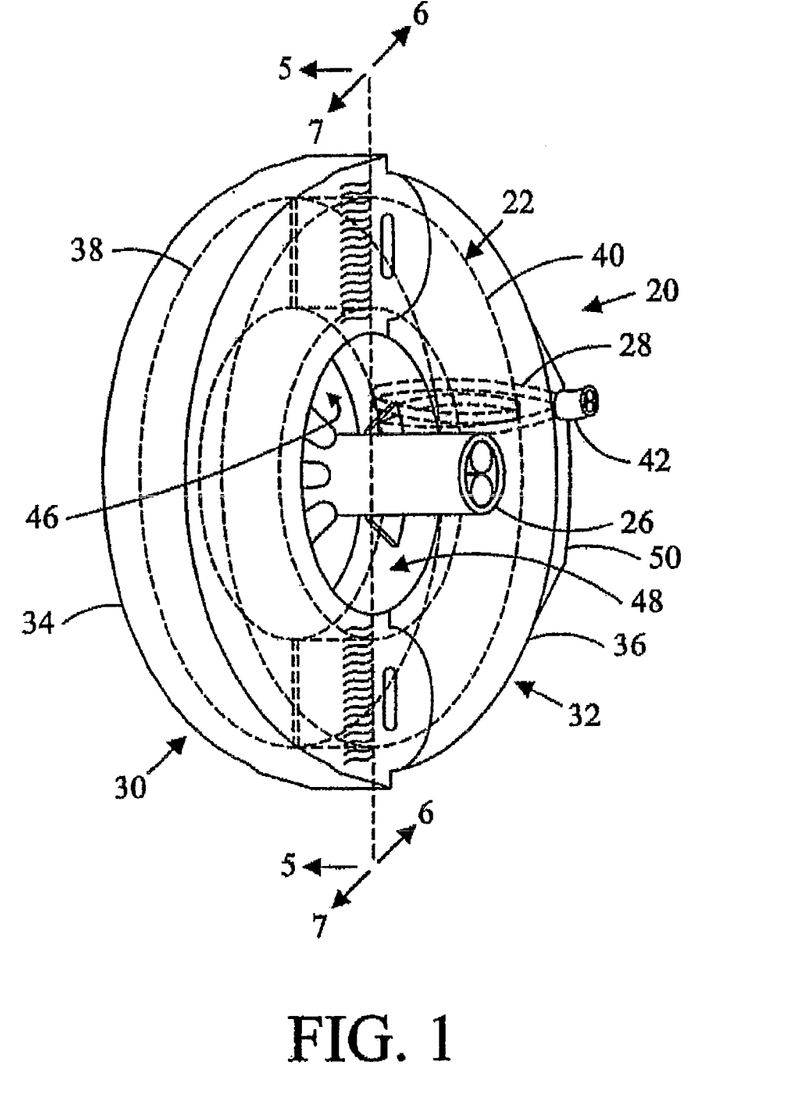
FIG. 1 illustrates a perspective schematic of a split core sensing transformer.
Figure 2:
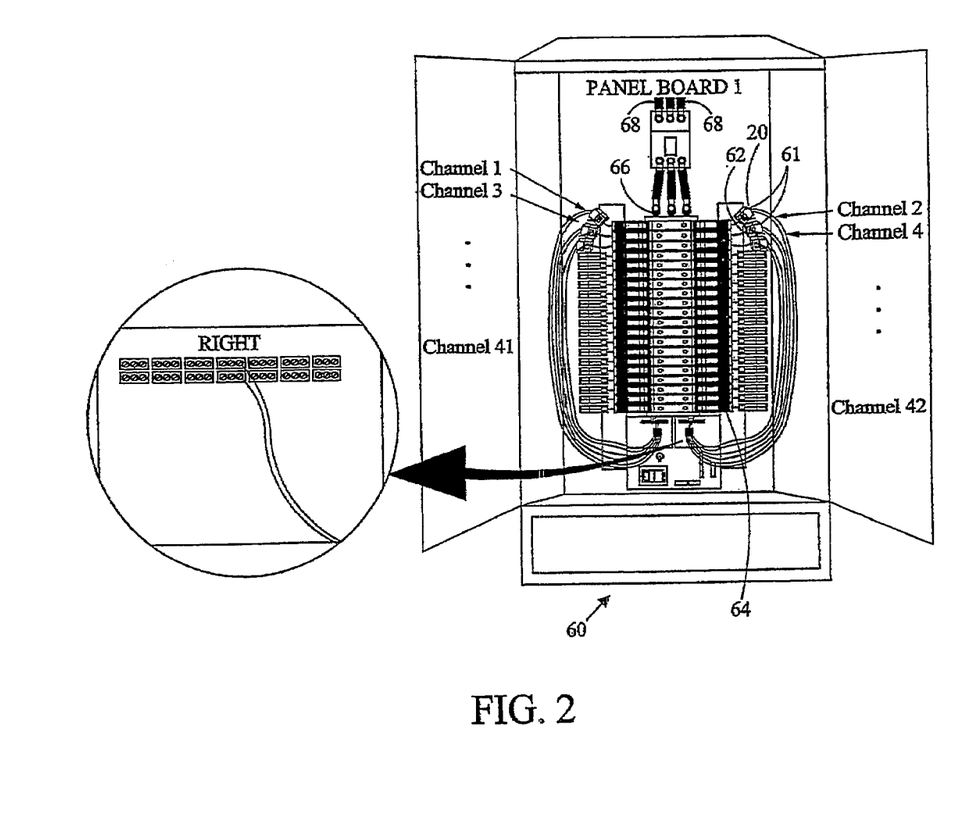
FIG. 2 illustrates a front view of an electrical distribution panel including a plurality of sensing transformers arranged to encircle branch electrical conductors.
Figure 3:
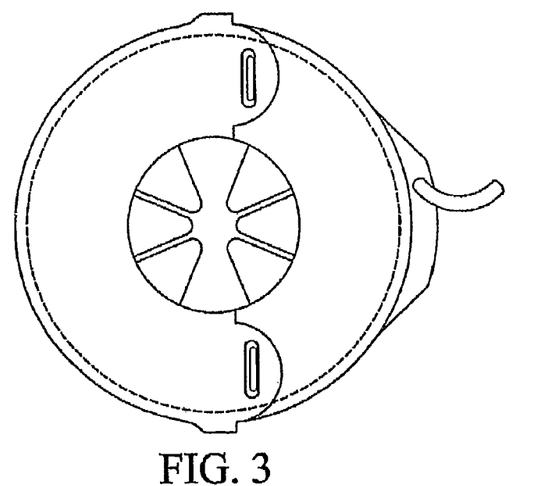
FIG. 3 illustrates a side elevation of a split core sensing transformer.
Figure 4:
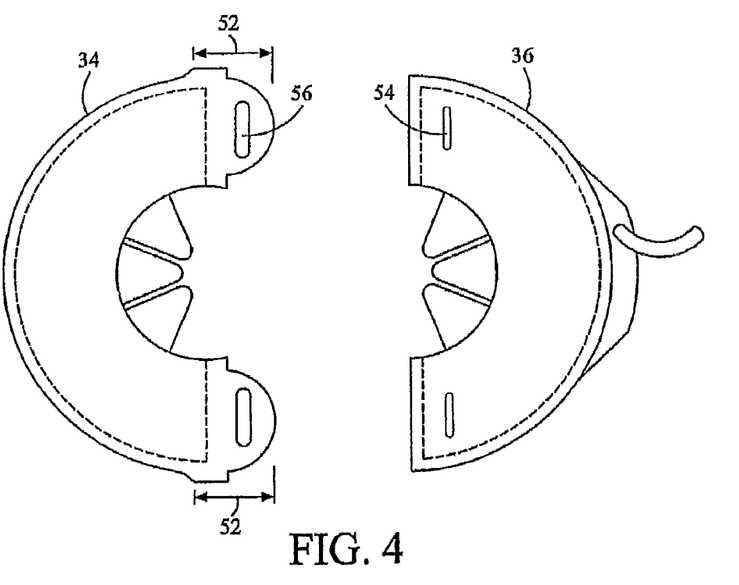
FIG. 4 illustrates a side elevation of the separated segments of the split core sensing transformer of FIG. 3.
Figure 5:
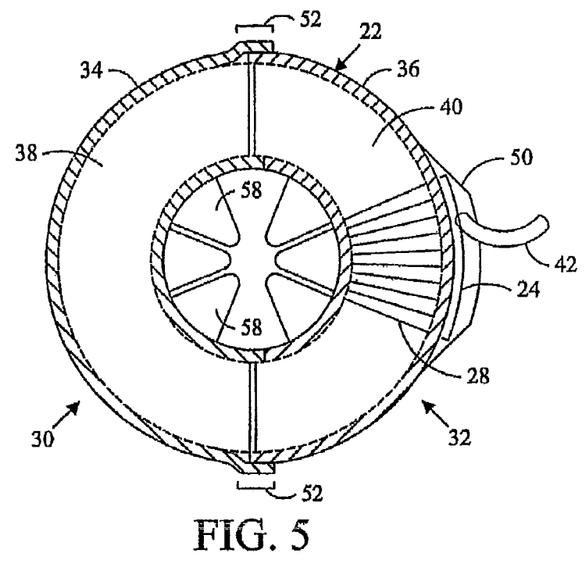
FIG. 5 illustrates a section view of the split core sensing transformer of FIG. 1 taken along line 5-5.
Figure 6:
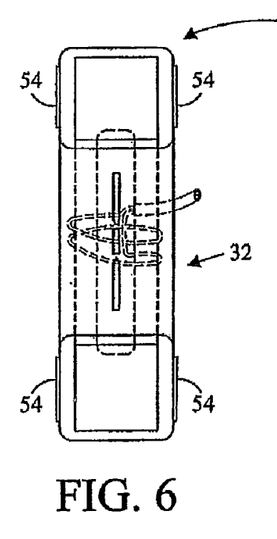
FIG. 6 illustrates a section view of the split core sensing transformer of FIG. 1 taken along line 6-6.
Figure 7:
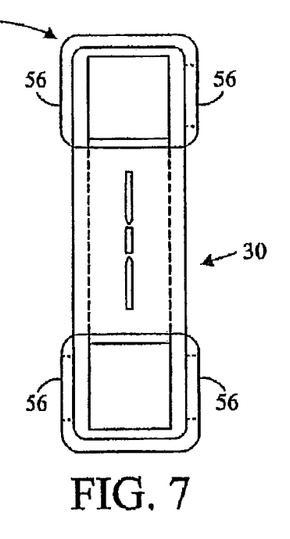
FIG. 7 illustrates a section view of the split core sensing transformer of FIG. 1 taken along line 7-7.

To measure the current in several branch circuits in a facility, sensing transformers are installed on each of the respective branch power conductors. Referring to FIG. 2, the sensing transformers 61 are typically installed on the branch power conductors 62 at the distribution panel 60 where the branch power conductors are connected to circuit breakers 64 that protect the branch circuitry from high current. The plurality of circuit breakers 64 are usually arranged immediately adjacent to each other in the distribution panel and are typically connected to bus bars 66 that are, in turn, connected to the input conductors 68 bringing power from the power grid to the distribution panel.

The branch power conductors 62 are typically attached to the respective circuit breakers 64 by a screw actuated clamp. Disconnecting a plurality of branch power conductors 62 to install encircling sensing transformers is time consuming and requires that power be disconnected from at least the branch circuit in which the transformer is to be installed. A hinged, split core sensing transformer permits the ends of housing halves, each retaining substantially half of the toroidal core of the transformer, to be spread apart so that the power conductor can be passed between the spread ends. With the power conductor centrally positioned between the housing halves, the housing halves are pivoted together encircling the power conductor with the toroidal core of the transformer.

Referring to FIGS. 1-7, the split core sensing transformer 20 comprises at least two separable transformer segments 30, 32. Each segment comprises a respective segment housing 34, 36 and a sector of a magnetically permeable toroidal core 38, 34 that, when installed, will substantially encircle an electrical power conductor 26. One or more turns of wire 28 is wrapped around the cross-section of a sector of the toroidal core 22. An alternating current in a conductor 26 passing through the central aperture 48 of the transformer 20 produces a changing magnetic field around the conductor that induces a magnetic flux in the magnetically permeable core 22. The magnetic flux, in turn, induces a current in the wire windings 28 on the core 22. The ends of the wire winding 28 are electrically connected through a cable 42 to a burden resistor (not shown) that converts the current signal received from the wire winding 28 of the sensing transformer 20 to a voltage signal representing the current flowing in the conductor.

The magnetically permeable core 22 comprises a ferrous material and is constructed of sectors 38, 40 that when arranged end-to-end form, substantially, a torus. The core 22 has a planar cross-section bounded by a closed curve that is typically rectangular or circular. The torus is the result of rotating the planar cross-section about an axis that lies in the plane of the cross-section but does intersect the plane of the cross-section. Each sector 38, 40 of the core 22 includes a curved inner surface 46 which will, when the sectors are arranged end-to-end, define the central aperture 48 of the sensing transformer 20. An exemplary sensing transformer includes a toroidal core of 3% silicon steel, grain oriented, with an outside diameter of 1.375 inches, an inside diameter of 1.125 inches, and a depth of 0.50 inches in a direction parallel to the axis about which the cross-section of the torus is rotated.

The sectors of the toroidal core 38, 40 are retained within respective separable housing segments 34, 36 that substantially sheath the cross-section of the toroidal core sectors. The housing segment 36 that encloses the core sector 40 that is wrapped with the wire winding 28 includes an extended portion 50 that encloses the connections of the wire winding to the conductors in the cable 42 that conducts signals from the wire winding to the instrumentation and provides an anchor for the cable.

A substantially tubular projecting portion 52 (indicated by a bracket) of walls of one of the housing segments 30 projects beyond the ends of the sector of the core 38 retained in the housing segment. The projecting portions 52 are enlarged to provide an interior sufficiently large to slidably accept in mating engagement the ends of the housing 36 of the other transformer segment 32. One of the housing segments 36 also includes a raised ridge 54 projecting from either side of the housing adjacent to the ends of the segment. Each of the raised ridges 54 is arranged to engage a corresponding aperture 56 in the wall of the mating housing segment 36 to prevent the engaged segments from separating. The surfaces of the housing segments 30, 32 that define the central aperture of sensing transformer 20 also include a plurality of resiliently flexible triangular fingers 58 projecting radially inward to provide a central opening for the power conductor 26. If the power conductor is larger than the opening provided by the ends of the triangular fingers 58, the fingers will bend resiliently outward to accommodate the power conductor. Typically, the housing is made of an electrically insulating thermoplastic material such as nylon or polyvinyl chloride (PVC).

To install the split core transformer 20 on a power conductor 26, the conductor is positioned between the separated segments 30, 32 of the transformer housing adjacent the surfaces that will form the central aperture 48 of transformer. The cooperating ends of the housing segments 34, 36 are aligned and the segments 30, 32 are pressed into mating engagement. When the housings 34, 36 of the segments 30, 32 are fully engaged, the two sectors 38, 40 of the core substantially encircle the power conductor 26 and the cooperating ridges 54 on the side of the housing of one segment mate with the corresponding apertures 56 in the housing of the other segment. Interference of the ridges 54 with a surface of the apertures 56 resists separation of the segments. The sensing transformer can be removed from the power conductor by inserting a screwdriver or other tool between the segment housings to release the mated ridges and apertures, permitting the segments to be separated. Signals from the sensing transformer are transmitted to the appropriate instrumentation through the cable 42. The housing may be omitted, if desired. A non-split core transformer with or without an associated housing may be used, if desired. The current transformer may be connected to the system by one or more flexible wires, the current transformer may be supported by a circuit board, a plurality of current transformers may be supported by a circuit board, or any other suitable configuration.

Figure 8:
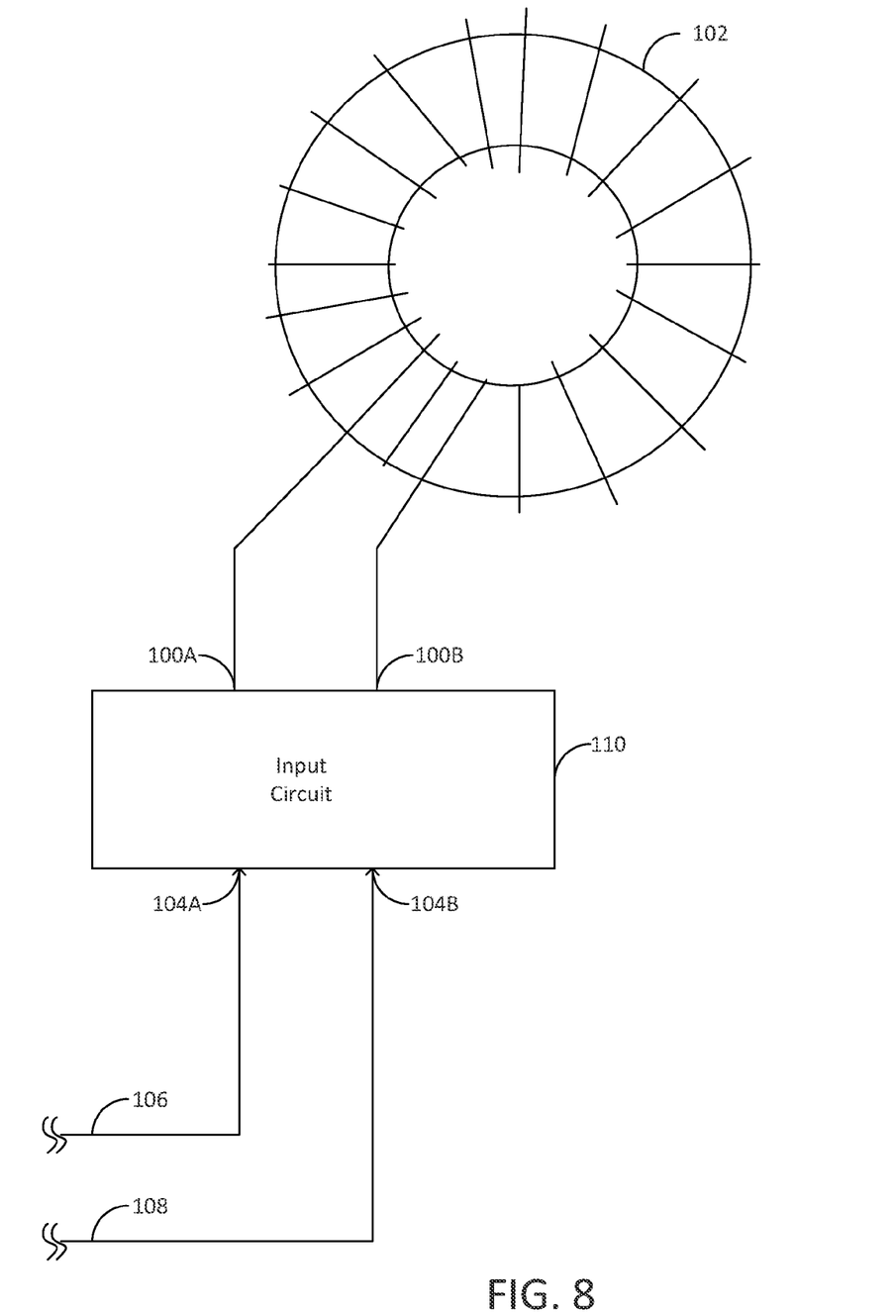
FIG. 8 illustrates a current transformer and an input circuit.

Referring to FIG. 8, the ends of the secondary windings of a transformer (split core, non-split core, high magnetically permeable material, low magnetically permeable material, etc.) 100a and 100b of the transformer 102 are electrically connected to an input circuit 110. The input circuit 110 may be included within a housing associated with the current transformer, may be included as a part of the current transformer, may be included on a circuit board proximate the current transformer, may be included on a circuit board not proximate the current transformer, may be included on a circuit board upon which the current transformer is supported, or any other suitable configuration. The input circuit 110 is designed to convert the voltage signal received from the transformer 102 (such as imposed across a resistor) to either a signal representative of the changing current in the power cable or a circuit condition at the output terminals 104a and 104b representative of the changing current in the power cable. The signal or circuit condition is provided to transmission lines 106 and 108 which are connected to an associated control panel or other electronic device. For example, the signal could be a current signal, voltage signal, or some sort of frequency modulation, amplitude modulation, or digital encoding. The circuit condition, for example, could be a short circuit, open circuit, or other suitable type of condition. The input circuit may be designed and constructed in any manner, so long as it converts the output signal from the transformer to an appropriate corresponding signal or circuit condition.

Figure 9:
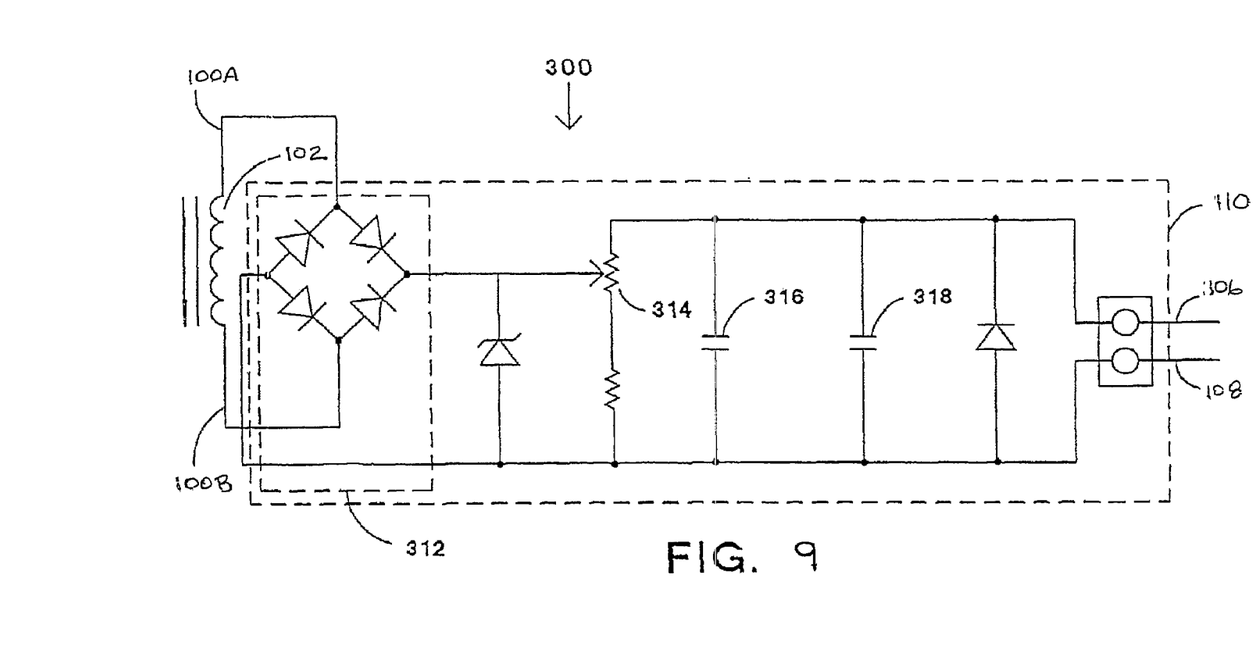
FIG. 9 illustrates a current transformer and an input circuit.

Referring to FIG. 9, an electrical schematic diagram of a current sensor 300 suitable to provide a full scale 0 volt to 5 volt output signal is shown. The transformer 102 encircles a power cable, producing a voltage between the ends 100a and 100b of its secondary winding. The ends 100a and 100b of the transformer secondary winding are connected to the input circuit 110 which includes a full wave rectifier 312, connected to a variable resistance 314 and associated capacitors 316 and 318, to scale the output of the full wave rectifier 312 to the desired range. The preferred range to interface with conventional control panels is 0 volts when no current within the power cable is sensed to 5 volts when the maximum desired level within the power cable is sensed. Unfortunately, the variable resistor has a tendency to change its resistance over time and is otherwise time consuming for the manufacturer to calibrate.

Figure 10:
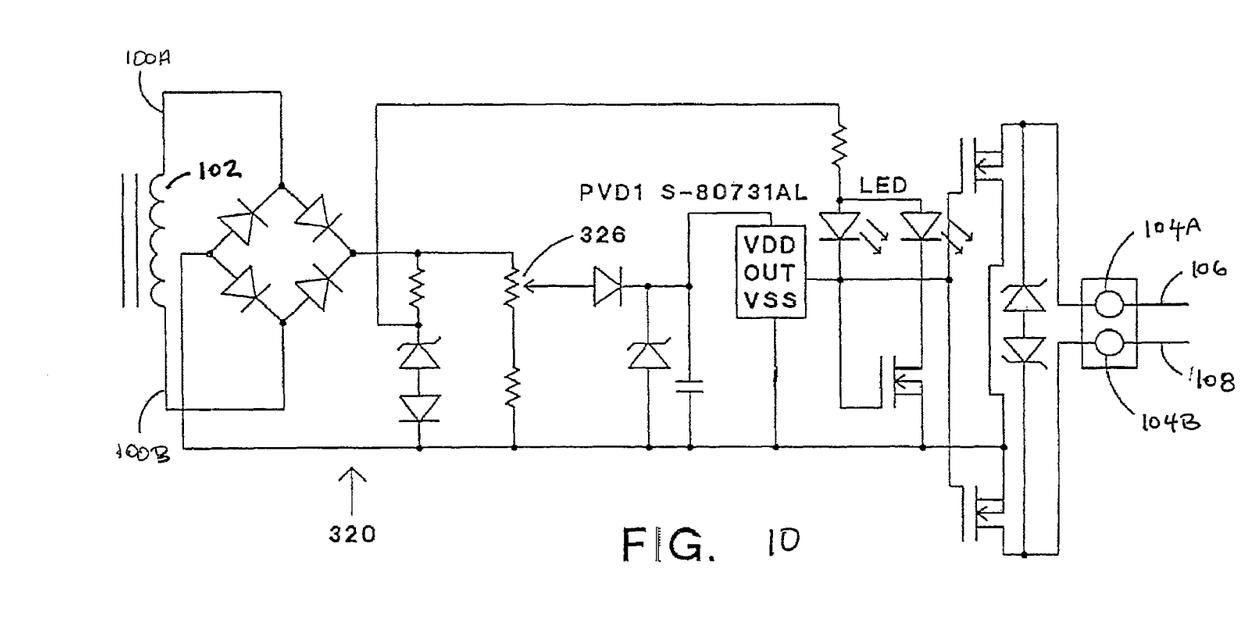
FIG. 10 illustrates a current transformer and an input circuit.

Referring to FIG. 10, current sensor 320 provides either an open circuit or short circuit at its output terminals 100a and 100b depending on whether the voltage signal produced in response to the current sensed by the transformer surpasses a predetermined threshold level. A variable resistor 326 sets the threshold level. Unfortunately, the variable resistor has a tendency to change its resistance over time and is otherwise time consuming for the manufacturer to calibrate.

Figure 11:
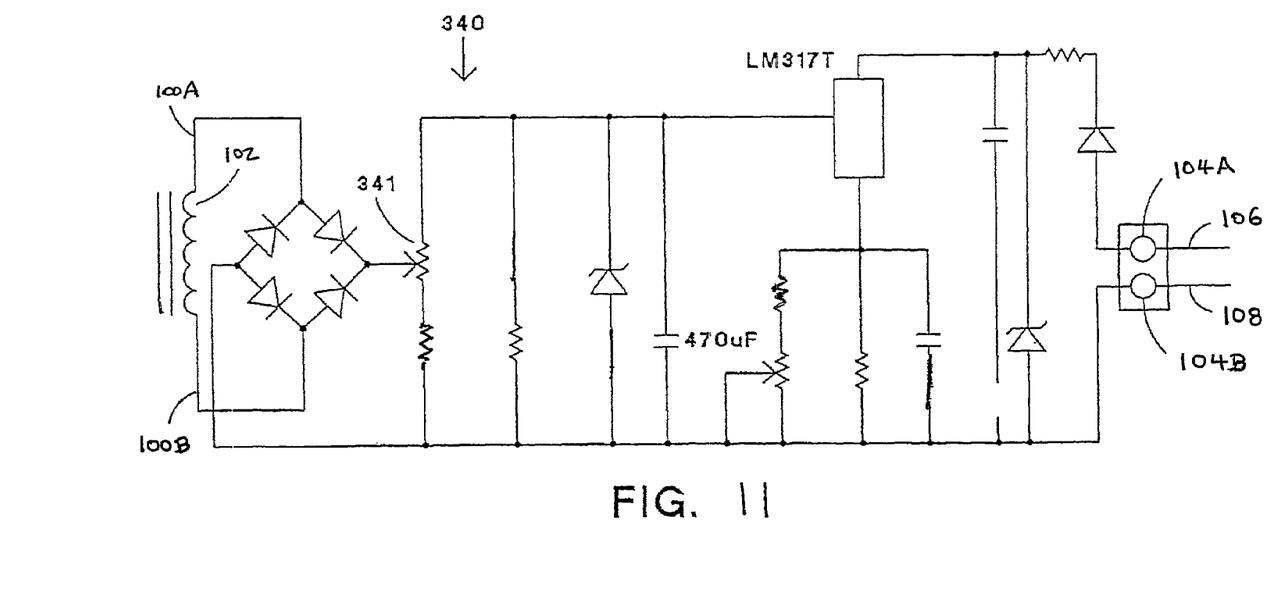
FIG. 11 illustrates a current transformer and an input circuit.

Referring to FIG. 11, current sensor 340 provides a 4-20 ma variable output signal at its output terminals 100a and 100b. When the current sensed in the power cable is 0 then the sensor circuit 340 puts out a 4 ma signal. When the current sensed in the power cable is equal to a desired maximum, when the variable resistor 341 is correctly set, then the sensor circuit 340 puts out a 20 ma signal. Unfortunately, the variable resistor has a tendency to change its resistance over time and is otherwise time consuming for the manufacturer to calibrate.

The current transformer(s) and the associated input circuit may be calibrated in some manner so that there is a known relationship between the changing current levels of the power conductor, and the resulting induced current and/or voltage in the wire. The calibration should model the relationship between the changing current levels and the induced current so that the changing current levels may be accurately estimated. Such calibration may be performed in a manual manner by changing the physical properties of the current transformer until it is within desirable tolerances. Similarly, this calibration relationship may be in the form of one or more scaling factors, one or more functions, one or more look up tables, and/or one or more electronic components to tune the calibration. The calibration factors, functions, tables, and/or electronic components may be included together with the current transformer or otherwise provided in association with the current transformer so that a suitable calibration may be achieved.

In addition to the calibration, it is desirable to calibrate the scale of the output of the input circuit. While a variable resistor may be used for such scale calibration it is time consuming to properly configure and may tend to drift over time. Another technique is to include a single value resistor instead of the variable resistor. Depending on the particular characteristics of the particular current transformer, the single value resistor may need to be switched to a different valued resistor. In this manner, the construction of the input circuit for the current transformer may involve the replacement of the single value resistor until a suitable resistor is selected. This process of replacing the single value resistor may be repeated until a suitable resistor for the particular current transformer is selected.

Figure 12:
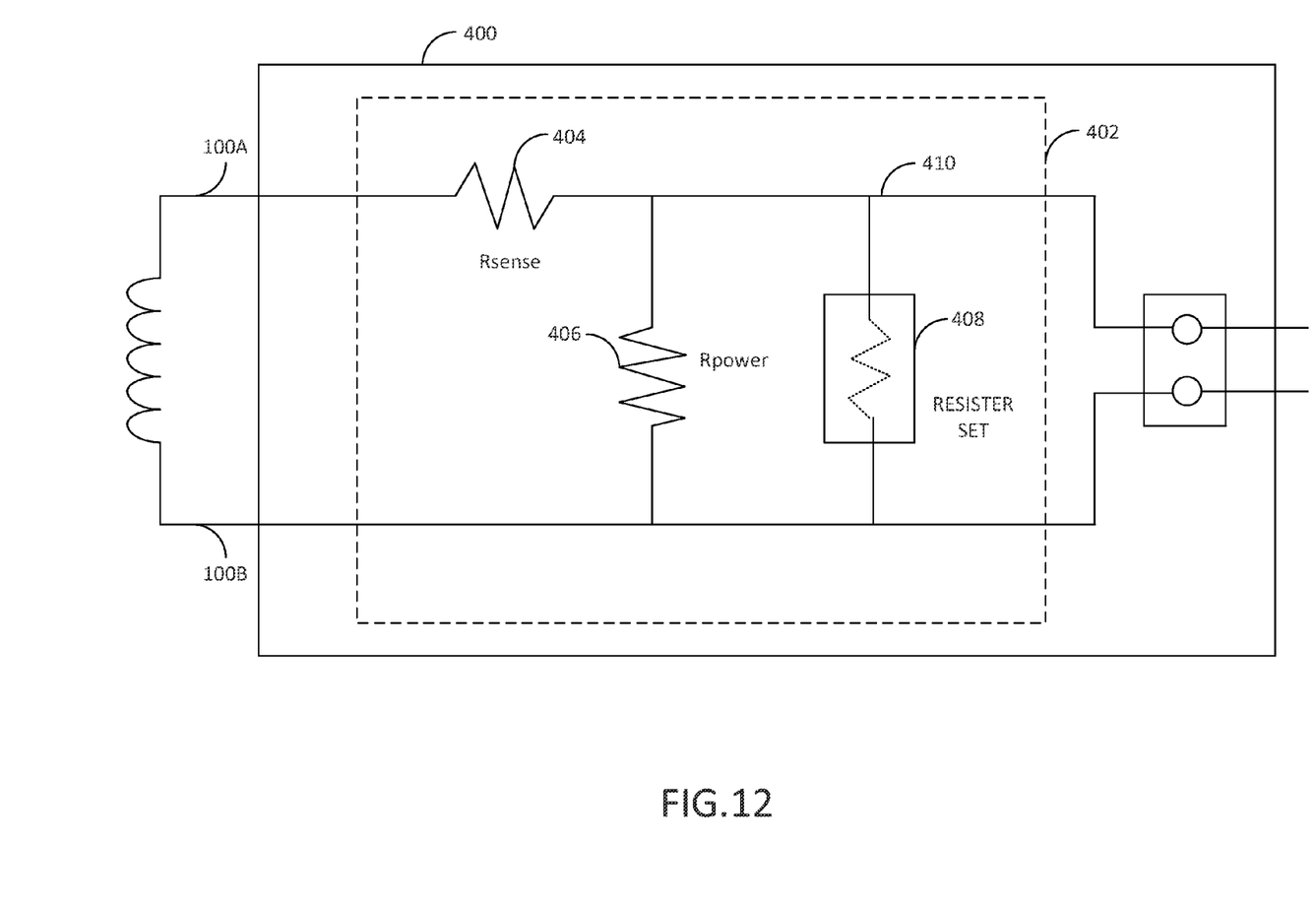
FIG. 12 illustrates a current transformer and an input circuit.

It is desirable to replace the traditional variable resistor and/or the select and replace process for selecting a suitable resistive value to adjust the scale of the output of the input circuit. Referring to FIG. 12, the current sensor to an input circuit 400 has outputs at 100a and 100b which preferably provide a changing current signal to an input circuit 400 that has some measurable range depending on the magnitude of the changing levels in the power conductor. The current induces a voltage drop across a resistor network 402. The resistor network 402 may include, for example, a Rsense resistor 404, a Rpower resistor 406, and a resistor set 408. The combination of resistor 406 in parallel with resistor set 408 provides a voltage divider with resistor 404 to determine a voltage point for the output level 410. By adjusting the value of the resistor set 408, the output level 410 may likewise be modified in a desirable manner. For example, an output of 0 to 10 volts may be achieved by suitable selection of the value of the resistor set 408. Other electrical components may likewise be included with the input circuit, as desired. The resistor network 402 may be modified to a different configuration, as desired.

The Rsense resistor 404 is preferably a resistor having suitable current carrying capability for the loads being imposed thereon. Similarly, Rpower resistor 406 is preferably a resistor having suitable current carrying capacity for the loads being imposed thereon. The individual resistors of the resistor set 408, may have a lower current carrying capability for the loads being imposed thereon, if desired, because of the other higher load carrying capacity resistors in the resistor network 402 and the plurality of resistors of the resistor set 408. The resistors may be physically located at any suitable location, such as part of the resistors being included with the current transformer (e.g., Rsense and/or Rpower) and others included on an associated circuit board (e.g., resistor set).

Figure 13:
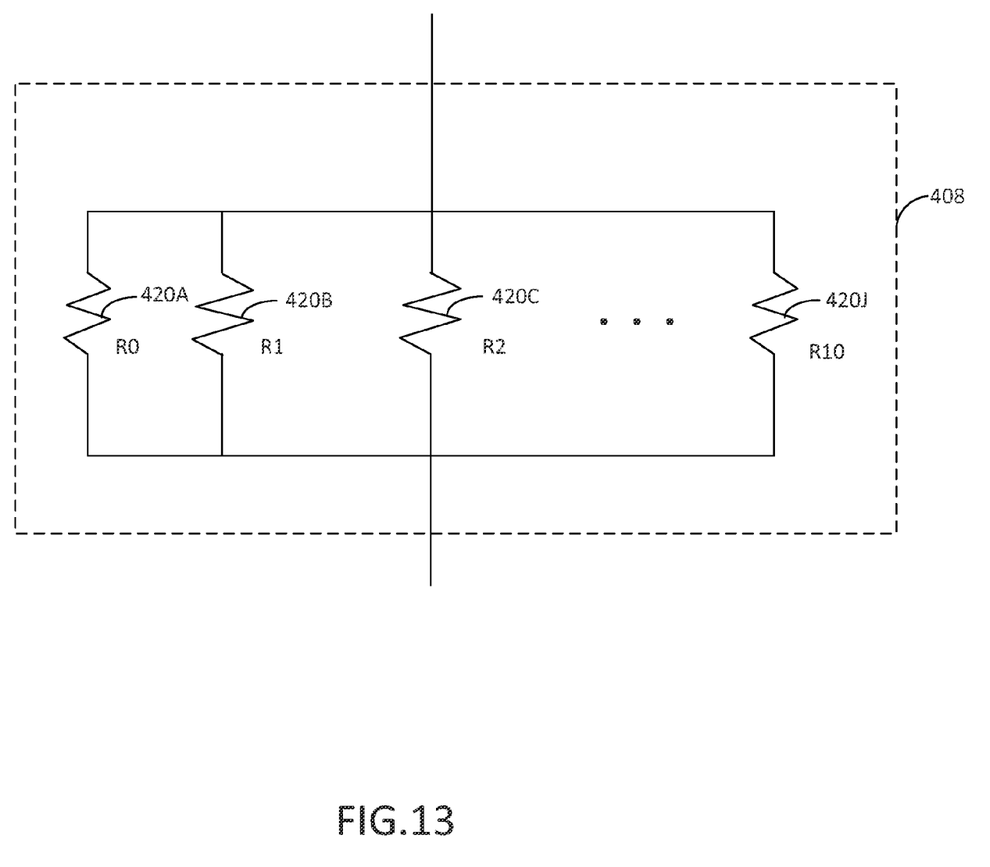
FIG. 13 illustrates an exemplary resistor set for an input circuit.

Referring to FIG. 13, the resistor set 408 may include a plurality of resistors arranged in a suitable arrangement, such as in a parallel arrangement, a serial arrangement, and/or a combination of both. The plurality of resistors may include, for example R0 420A, R1 420B, R2 420C, . . . , R10 420J. The resistors of the resistor set 408 are preferably surface mount technology based resistors which are especially suitable for being automatically attached to a circuit board together with associated electrical traces. The resistors R0 . . . R10 provide an effective resistance, which may be modified by either selecting different resistors R0 . . . R10 and/or omitting selected resistors.

Figure 14:
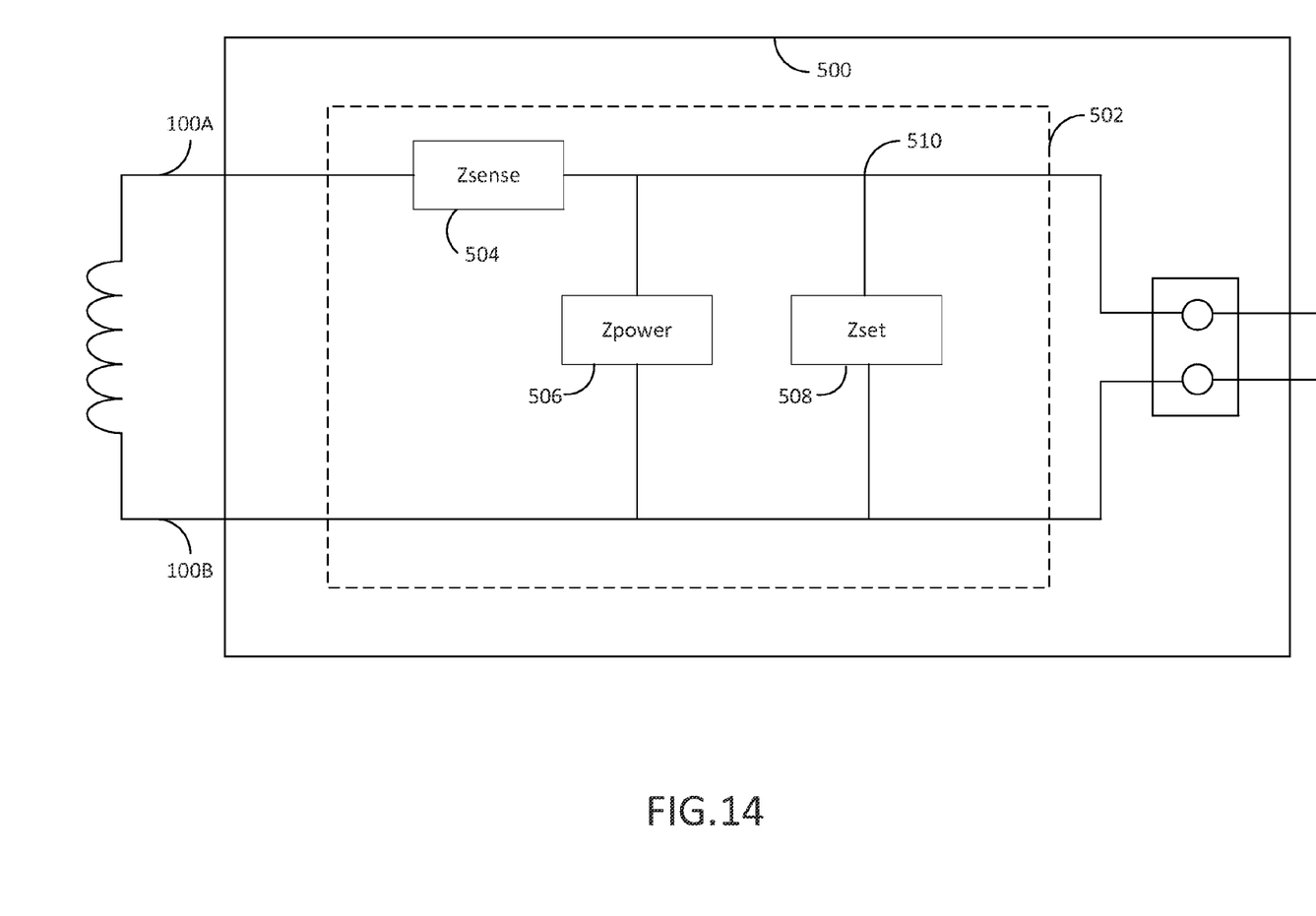
FIG. 14 illustrates an exemplary impedance set for an input circuit.

It may also desirable to replace the traditional variable resistor and/or the select and replace process for selecting a suitable resistive value to adjust the scale of the output of the input circuit and/or adjust for phase shifts. Referring to FIG. 14, the current sensor to an input circuit 500 has outputs at 100a and 100b which preferably provide a changing current signal to an input circuit 500 that has some measurable range depending on the magnitude of the changing levels in the power conductor. The current induces an impedance change across an impedance network 502. The impedance network 502 may include, for example, a Zsense 504, a Zpower 506, and an impedance set 508. The combination of the impedance 506 in parallel with the impedance set 508 provides a divider with impedance 504 to determine a voltage point and/or phase relationship for the output level 510. By adjusting the value of the impedance set 508, the output level 510 may likewise be modified in a desirable manner The Zsense 504 may be any combination of resistor(s), capacitor(s), and inductor(s). The Zpower 506 may be any combination of resistor(s), capacitor(s), and inductor(s). The Zset 508 may be any combination of resistor(s), capacitor(s), and inductor(s). By way of example, by including selected capacitors, the phase shift for the current transformer may be adjusted. By way of example, by including selected resistors, capacitors, and/or inductors, the output impedance of the current transformer may be matched. For example, an output of 0 to 10 volts may be achieved by suitable selection of the value of the impedance set 508. Other electrical components may likewise be included with the input circuit, as desired. The resistor network 502 may be modified to a different configuration, as desired.

The Zsense 504 is preferably one or more elements having suitable current carrying capability for the loads being imposed thereon. Similarly, Zpower 506 is preferably one or more elements having suitable current carrying capacity for the loads being imposed thereon. The individual elements of the impedance set 508, may have a lower current carrying capability for the loads being imposed thereon, if desired, because of the other higher load carrying capacity elements in the network 502 and/or the plurality of elements of the impedance set 508. The electrical elements may be physically located at any suitable location, such as part of the elements being included with the current transformer (e.g., Zsense and/or Zpower) and others included on an associated circuit board (e.g., impedance set).

Figure 15:
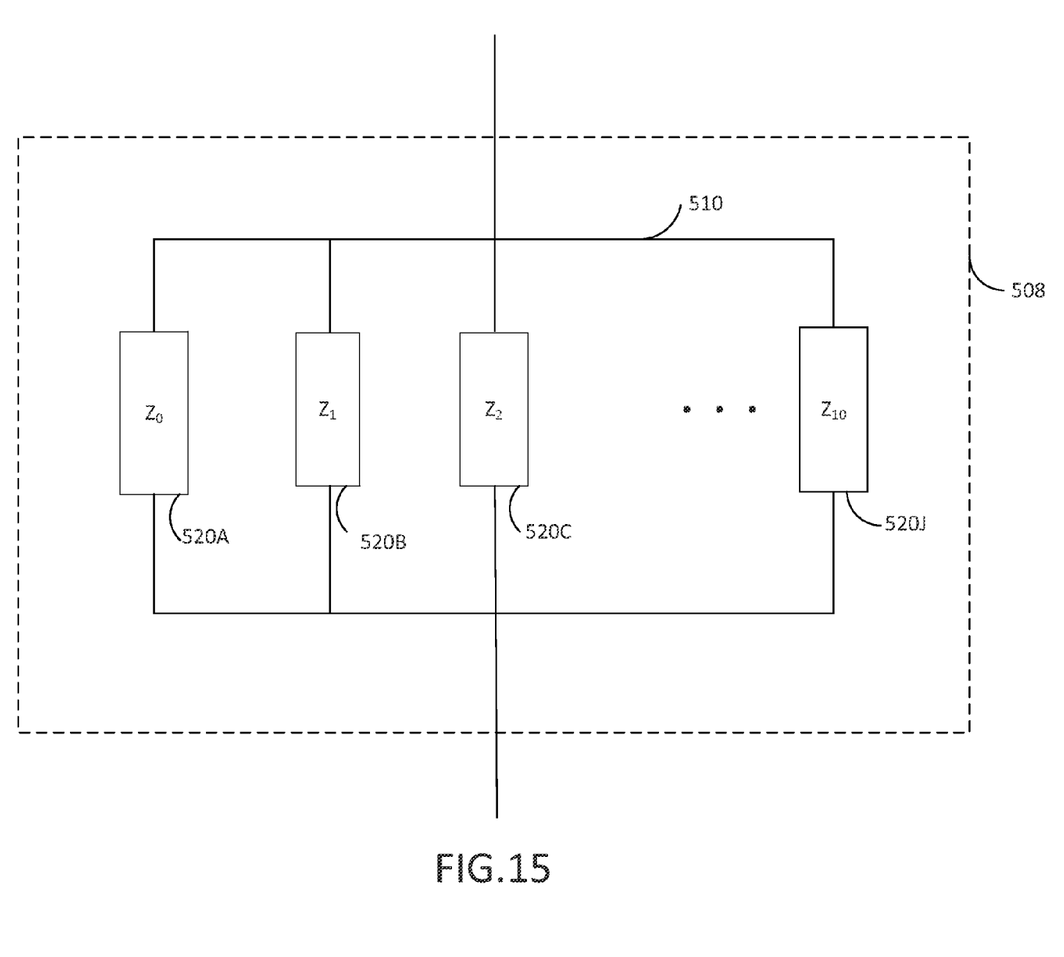
FIG. 15 illustrates an exemplary impedance set for an input circuit.

Referring to FIG. 15, the impedance set 408 may include a plurality of impedance elements arranged in a suitable arrangement, such as in a parallel arrangement, a serial arrangement, and/or a combination of both. The plurality of impedance elements may include, for example Z0 520A, Z1 520B, Z2 520C, . . . , Z10 520J. The impedance of the impedance set 508 are preferably surface mount technology based elements which are especially suitable for being automatically attached to a circuit board together with associated electrical traces. The impedance elements Z0 . . . Z10 provide an effective impedance, which may be modified by either selecting different impedance elements Z0 . . . Z10 and/or omitting selected impedance elements.

Test equipment may be used to characterize the particular current transformer associated with the particular input circuit. After characterization of the particular current transformer in some manner, the test equipment may determine what the desirable resistance levels of the effective resistor set 408 are to achieve the desired operating point for the output level 410. Once the desired effective resistance value of the resistor set 408 is determined, the test equipment may electrically isolate selected resistors, such as by supplying sufficiently high current to sever the traces to the selected resistors. In addition, by selecting a different Rpower resistor and/or Rsense resistor, the total burden may be suitable scaled up or down, thus permitting the same resistor set 408 to be used for current transformers with substantially different characteristics. For example, a suitable trace for being selectively severed for a selected resistor may be included in series with each of the resistors of the resistor set 408. By way of example, a fusible section of a trace may be included proximate each terminal of each resistor of the resistor set 408, where a pair of fusible sections are severed to remove a selected resistor of the resistor set 408 from contributing to the effective resistance of the resistor set 408. The same applies to the impedance elements of FIG. 14 and FIG. 15, such as for example, modification of the phase.

The test equipment operator may identify the current transformer type and size, and from this the test equipment may determine what resistors are available on the board yielding all the possible total burden resistance combinations. The test equipment may generate a primary current which in turn induces a voltage drop across the Rsense resistor which may be readily measured. Based upon the measured voltage drop the secondary current may be determined (I=voltage/Rsense). Based upon the relationship between the primary and secondary currents, the desired burden resistance may be determined and in particular the desired effective resistance of the resistor set 408 may be determined, given a selected Rsense and Rpower (if included). The preferred set of resistors of the resistor set 408 are determined, and those resistors that are not needed are severed by the test equipment, such as by 'blowing' the selected traces. As a result, the input circuit includes resistors that are ultimately not included as part of the effective resistance of the resistor set 408. The same applies to the impedance elements of FIG. 14 and FIG. 15, such as for example, modification of the phase.

The test equipment may track the resulting burden resistance included with each input circuit and its associated current transformer. The changes in the burden resistance over time, if any, being provided to the current transformers may be correlated to the properties of the current transformers. This tracking of the selected resistance values relates to the properties of the current transformers which may be monitored to ensure the quality of the current transformers. Based upon such tracking, the manufacturing properties of the current transformer maybe modified, as appropriate. The same applies to the impedance elements of FIG. 14 and FIG. 15, such as for example, modification of the phase.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method for configuring a transformer for monitoring current in a power cable comprising:
    (a) magnetically linking said transformer with said power cable connected to an electrical device, where said transformer producing a changing transformer signal in response to the presence of a changing current within said power cable;
    (b) receiving said changing transformer signal by an input circuit located proximate to said transformer and having an output terminal and being electrically connected to said transformer so as to said receive said changing transformer signal, and said input circuit producing, in response to receiving said changing transformer signal, one of a first signal representative of said changing current, and a first circuit condition at said output terminal of said input circuit representative of said changing current in said power cable;
    (c) selectably electrically severing at least one resistor of a resistor set having a plurality of resistors having an effective resistance from the remaining said resistors of said resistor set of said input circuit, and selectably electrically severing said at least one of said resistors from said transformer when said at least one of said resistors is said selectably electrically severing from said remaining said resistors of said resistor set.

2. The method of claim 1 wherein said plurality of resistors of said resistor set includes an associated fusible trace.

3. The method of claim 1 wherein said plurality of resistors includes a plurality of said associated fusible traces.

4. The method of claim 1 wherein said plurality of resistors are surface mounted onto a board.

5. The method of claim 1 wherein said plurality of resistors includes a first resistor in series with said transformer.

6. The method of claim 5 wherein said plurality of resistors includes a second resistor in parallel with said transformer.

7. The method of claim 6 wherein said plurality of resistors includes a third resistor having a plurality of fusible resistors.

8. The method of claim 7 wherein each of said fusible resistors includes a respective fusible trace.

\* \* \* \* \*